(12) United States Patent
Gergely et al.

(10) Patent No.: US 6,917,315 B2
(45) Date of Patent: Jul. 12, 2005

(54) MODEL BASED CODE COMPRESSION

(75) Inventors: Tamás Gergely, Füzesgyarmat (HU);
Ferenc Havasi, Szolnok (HU); Árpád Beszédes, Szeged (HU)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/684,267

(22) Filed: Oct. 9, 2003

(65) Prior Publication Data

US 2005/0078017 A1 Apr. 14, 2005

(51) Int. Cl.[7] .................................................. H03M 7/00
(52) U.S. Cl. ........................................ 341/79; 341/51
(58) Field of Search ............................ 341/50, 51, 65, 341/79, 87

(56) References Cited

U.S. PATENT DOCUMENTS

| | | | | |
|---|---|---|---|---|
| 5,635,931 A | * | 6/1997 | Franaszek et al. | 341/51 |
| 5,640,159 A | * | 6/1997 | Furlan et al. | 341/51 |
| 5,995,027 A | * | 11/1999 | Henry | 341/50 |
| 6,225,922 B1 | * | 5/2001 | Norton | 341/87 |
| 6,269,192 B1 | * | 7/2001 | Sodagar et al. | 382/240 |
| 6,794,999 B1 | * | 9/2004 | Said | 341/67 |

OTHER PUBLICATIONS

"Automatic Inference of Models for Statistical Code Compression" by C.W. Fraser, Proceedings of PLDI'99, pp. 242–246, May 1999.
"Efficient Algorithms for Constructing Decision Trees with Constraints" by M. Garofalakis et al, Knowlege Discovery and Data Mining, pp. 335–339, 2000.

* cited by examiner

Primary Examiner—Michael Tokar
Assistant Examiner—Linh V. Nguyen

(57) ABSTRACT

The invention relates to a code compression method that has a phase for treatment of model, the phase comprising a pruning phase and a growing phase combined into one phase. According to the method, test data can be used in estimation of the cost for the treatment of model when evaluating whether or not to apply a treatment of model in the phase for a certain code to be compressed according to the model.

27 Claims, 8 Drawing Sheets

MODEL BASED CODE COMPRESSION

BACKGROUND OF THE INVENTION

1. Technical Field

The embodiments of the invention relate in general level to a field of automated information techniques, but more specifically to an improved code compression method. The invention relates also to a system for code compression. The invention relates also to a network element for communicating code over a boundary layer between said network element and a second network element of a communications network. The invention relates also to computer program products in machine-readable form for executing the above mentioned method or system.

2. Discussion of Related Art

It is a communication capacity of the network that sets an upper limit for the quantity of information passed through the network. When developing communications, the complexity of the information loads the available resources that seem to run out from the users, when the services and hardware takes their turn in the evolution. However, one direction of the development points to the capacity increase and towards larger amounts of data being transferred. Accordingly, new applications may eat up very quickly the additional benefits of the new techniques. Another way than capacity increase, to mitigate the communications needs is to compress information to be sent. One important field in that is code compression, in which the information to be transmitted and/or stored is processed so to achieve a packed format, in which the information has a smaller effective volume to be treated, but larger information density than the original information as such. Such densification is made normally by an algorithm, directed according to certain predetermined rules, definable to the user, such densification phase called packing. An inverse operation of the packing, unpacking, restores the original information as such from the packed format. In the old days of techniques, it was advantageous to drop out so called empty bits and/or portions and thus increase the density of the information.

However, it was noted that it is not necessary to transfer and/or store all the information from the original data as such. Even significant part of a file can be omitted, if there is a detectable period of data. In such a case it is sufficient to send only one such period and the number of times to be repeated in certain order.

It is also possible to drop out from a file some parts of it, which do not actually comprise significant information for the purpose of the use in the file. In picture formats as well as in audio formats, the files can be processed by such techniques to achieve a result in which the user won't sense the loss of the information from the original file or such loss can be interpolated back into the file to a certain degree, if needed. A man skilled in the art recognizes such several pictures and audio formats as well as utilization of several ZIP-algorithms or similar known variants of them at the priority date of this application. Such techniques belong to a passive way of compressing code and do not actually have relevance to the specific field of technology in which the invention belongs to.

In general, code compression is important in several areas of information techniques, especially in those fields that use e.g. embedded systems, where the storage space may be very limited in respect to the information to be processed.

For a performance of successful code compression, especially when dealing with automatically performing applications, the compression can be dealt into phases, in which the code is processed, for transfer and/or storage. Such processing generically involves recognition of the parts of the code for compression. For instance, the degree of compression can be ruled by certain predetermined values defined by the compression algorithm user. However, the algorithm needs to decide in some phase what to do and in what extent. To guide such operation, certain rules are needed. In automated approach, the critical compression parameters can be set by the operator or, they can be deduced from the file itself, its structure and/or the file type, in order to convey the information to the algorithm for fulfillment of the compression according to the rules.

Those rules are driven by the compressors, which can be categorized into non-model based and model based, as featurized according to that are they using a model or not in the compressing. In a coding performed without a model, a compression table is needed for determination of the code words for all input elements, which are called also tokens, but the compression table is generated from each input file every time when the file is to be compressed and encoded so that the input uses its own table. Whereas in the model based techniques, such a table is generated from all input, and then each input is encoded by using such a common table every time.

An example is considered relating to file transfer. For example, if a first file with a first size would be sent through a network, said first file would be compressed as much as possible. In model based techniques a model is created. The model has a certain model size. When the first file is compressed according to the model, the result of the compression, a second file, is produced, having a certain second size. When decompressing, the model is used in order to decompress the second file.

However, the network capacity needed for transferring the whole data, for decoding, should provide bandwidth for a transferred file with a size as the model size plus the second size. Therefore, in order to save transfer capacity, the transferred file size would be beneficially minimized. However, it is problematic, that during a model creation by compressing an actual part of the first file, it is almost impossible to count the size of the actual part of the second file in the required time scale for the compression.

A sequence of operations and/or decisions can form a tree type structure. As well as real trees have greens and leaves in the nature, branching further towards finer and finer structures, consequential decisions of a code compression algorithm may form similar branches, as operations and/or decisions to focusing finer and finer structures of the file to be further processed as long as there is some code left to be compressed in the light of the predetermined rules and the table for the compression.

Such process may in disadvantageous conditions lead to complicated rules and even larger descriptions of the performed operations made, than the code itself to be coded. Time may be needed also for decoding very complicated structures, so that the more complicated a structure has, the more time would be used.

It is one common code compression technique that uses a model for splitting the coding into phase of learning, comprising building and pruning phases of the tree and a phase of coding using the model. In the building phase the tree is grown from a single node and an order of decisions are given. To reduce the complexity and size of the model the tree is pruned to the required level (this way the precision of the tree is reduced while maintaining its compression capability).

A skilled man in the art recognizes from a publication [1] Christopher W. Fraser—Automatic Inference of Models for Statistical Code Compression. In *Proceedings of PLDI'99*, pages 242–246, May 1999 a method for building a decision tree as described therein. In [1] the decision trees are used as models of coding. Binary trees are built, but not actually pruned. Instead, in order to reduce the size these trees are simply transformed into DAGs by merging similar leaves (DAG as Directed Acyclic Graph that do not contain cycles, as a skilled man in the art would immediately recognize).

A skilled man in the art recognizes from a publication [2] Minos Garofalakis, Dongjoon Hyun, Rajeev Rastogi and Kyuseok Shim—Efficient Algorithms for Constructing Decision Trees with Constraints. In *Knowledge Discovery and Data Mining*, pages 335–339, 2000 a method for tree pruning. In [2] the method for tree pruning is described using cost functions, which involves only the size of the tree. Garofalakis et al. developed a method that first builds the full tree, which is then pruned in such a way that the result would be encoded in to the minimal functional size. However, that method does not involve the information content of the tree when pruning. The tree is not used as a model of coding as such, but for other purposes.

Decision trees are commonly used in data mining. Commercially available packets as CART and C4.5 are available. The known decision trees are binary and rooted trees. http://www.cse.ucsc.edu/reserarch/compbio/genex/otherTest.html links to an Internet page [3], in which it has been described a tree evaluation and growing/pruning of a tree. The document provides a description on classifiers of internal nodes against a certain threshold. In addition to the standard algorithm as considered the C4.5., a hyperplane techniques is referred in relation to an OC1 system, as well as to an improved version of it, called therein as MOC1, which also relates to Vapnik-Chervonenkis theory.

Parzen windows classification, a generalization of a technique of k-nearest neighbors, relates to a known technique. In such techniques nonparametric density estimation is used. It is also known to use approximate densities for a posterior probability. The Parzen windows classification algorithm does not need a training phase, but lack of sparseness can make the performance of the algorithm slow.

Fisher's linear discriminant and Fisher's criterion relate to projecting a high dimensional data onto a line and performing classification in one dimension. It is also described in [3] that a cost function can be optimized on a training set for a threshold determination.

FIG. 1A indicates a model based code compression method, which method comprises phases of starting 1 a model based coding, creating 2 a model, a utilisation phase 3 of the model for compressing and/or decompressing and an ending phase 4 of the model based coding. In phase 3 the model is used for compressing/decompressing the code. The phase 4 ends the process.

The phase 2 in FIG. 1A is described in more detail in FIG. 1B. Model creation is started in sub-phase 21. Such phase may comprise a sub-step of selecting and/or adjusting the model to be used in the coding session. In phase 22 the input data that has significance for the coding session according to the method in 1A, is processed into utilizable form for the model and the grow/prune sub-phase 23 in FIG. 1B.

The sub-phase 23 is illustrated in FIG 1C. In the sub-phase 23 there are sub-steps or sub-phases of starting 231 the grow/prune phase of the model for utilisation for the code compression/decompression, which both are called also as treatment of code. The phase 23 comprises a tree growing phase 232 and a tree pruning phase 233, which as separately performed, each are separately described in more detail in FIGS. 1D and 1E, respectively.

The sub-phase 23 has also an ending phase 234, which involves steps that are necessary for stopping the process for the sub-phase 23. The phase 234 can comprise however steps that are related to the product from the sub-phase 23.

The sub-phase 232 has sub-phases that are described in FIG. 1D. The sub-phase 2321 starts the growing of a tree with the necessary preparation for the means and data to be used in the growing phase 2322. In phase 2322 a sub tree is grown at a root. The sub tree growing is stopped in the phase 2323.

The sub-phase 233 has sub-phases that are described further in FIG. 1E. The subphase 2331 starts the pruning of a tree with the necessary preparation for the means and data to be used in the pruning phase 2332. In phase 2332 a sub tree is pruned at a root. The sub tree pruning is stopped in the phase 2333.

In FIG. 1F the sub-phase 2322 is described in more detail. There are sub-phases of starting 23221 a sub tree growing at a node, a check phase 23222 weather or not a stopping criterion is met that is defining in which conditions the sub tree growing should stop in the sub-phase 2322. If the stopping criterion is met, no children are created in the phase 23223, and the sub-phase continues by skipping the phase 23224 to the stopping phase 23225 of the sub tree growing. If the stopping criterion in the phase 23222 is not met, children are created in the phase 23223 where and/or when needed. Since children were created in phase 23223, in phase 23224 a sub tree is grown at each child. The stopping phase 23225 stops the sub-phase 2322.

In FIG. 1G the sub-phase 2332 is described further in more detail. There are sub-phases of starting 23321 a sub tree pruning at a node, a check phase 23322 weather or not a stopping criterion is met that is defining in which conditions the sub tree pruning should stop in the sub-phase 2332. Such stopping criterion comprises a check weather or not the node is a leaf. If the node is a leaf the pruning is stopped for that node. If the node is not a leaf, the process continues in phase 23323 by pruning sub tree at each child. The costs are evaluated in phases 23324 and 23325 for a decision phase 23326. In phase 23324 a cost C1 is evaluated for all children plus for an internal node. In phase 23325 a cost C2 for a leaf is evaluated instead of a node. In the decision phase 23326 it is studied if the cost C1 is less than C2 in which case a child is not removed, but if the C2 is equal or less, a child is removed. A decision is made between two possibilities: keep the children (which has a cost C1) or drop them and replace the sub tree with a leaf (which has a cost C2). The cost would be minimized, so we do the operation belongs to the lower cost. Thus, if C1 is less than C2, so the children are kept, but if C2 is less than C1 they are dropped. In case of equality (C1=C2) a simpler structure is chosen, a leaf, so the children are also dropped. The stopping phase 23327 stops the sub-phase 2332.

For a proper use, it is necessary that the compression can be made backwards, but preferably with no errors or in tolerable margins. Such code compression algorithms that either have an inverse algorithm or comprise itself such are here called "bijective". Nevertheless, such bijective algorithms always have or comprise themselves an inverse algorithm, for doing the code compression backwards. Such pair of algorithms can be regarded as operators and their inverse operators, respectively. Especially model-based algorithms that have the bijective property are very useful.

To be noted in the terminology, a term method is used as a series of actions that is used as a normal language in common patent terminology. Nevertheless, a term algorithm is used to refer to such a method that comprises method steps especially advantageous for an implementation by a computer or similar.

The term code should be understood in here also as a file, which can be just a data file or a series of commands, preferably executable by a processor of a computer, independently, on which form the code is presented for a computer for execution. A file can be almost any suitable ensemble of mechanically and/or electromagnetically handled values or characters provided it is commonly understood in the field of the technique of this application, and also provided that it is in a machine-readable form.

When making programmatic structures for an executable file, before such file becomes an executable in a processor, the file must be coded or translated form a language to another, which is more relevant to the hardware and the execution in it. In such case, there can be often programmatic structures, such as commands or combinations thereof, written in several times, which may disadvantageously only increase the size of the file. Therefore the files can grow into extremely large sizes. Sometimes as large as even the programmer cannot know what for certain lines were written. Automation of such may leave even more such structures that are repeated in several times more than a human programmer. Such repeated structures would be sufficient to write only once in the coded code and link to the point where such structure was used for guarantee the correct performance but a reasonable size of the file. When using a model that comprises a suitable pruning phase of the code can also reduce errors or human mistakes in addition of saved memory and time of execution.

To explain the term tree and relating terminology, some terms are considered, although a skilled man in the art knows their meaning in the field. A "node" and "(directed) edge" are mathematically used terms of graphs. A graph can be drawn on a paper for instance. When drawn, a node becomes a "point" in the paper, and a directed edge between two nodes becomes an "arrow" between two points on the paper. So "node" and "point" means essentially the same, as well as "directed edge" and "arrow". A directed graph has nodes, also called points, as well as directed edges, also called arrows, between the nodes. A term tree means in here a special kind of (directed) graph: All but one node have exactly one incoming edge. (All but one point has exactly one arrow that points to it.) A node that has no incoming edges is called a root. One node can have many outgoing edges. (In other words, there can be many arrows starting from a point).

The nodes that are pointed by the outgoing edges of a parent node are called children of said parent node. A node that has no children is. called a leaf. Each node in a tree is a root of a sub tree of said tree. If an incoming edge of said node is deleted and if said node is the root, a tree can be formed that was a part of the original said tree. In extreme case each tree is a sub tree of itself.

The problems relating to the conventional model based code compression according to known techniques are to be solved, at least mitigated considerably by the merits of the embodiments of the invention.

DISCLOSURE OF INVENTION

The problems are solved and/or mitigated by using a model based compression algorithm that comprises a tree growing and/or pruning in the model creation.

According to a first aspect of the invention, a method for improved code compression is provided, characterized in that the method comprises a model creation phase which has a phase of treatment of model comprising growing a sub tree into a tree of said model and a phase of pruning said sub tree.

According to a second aspect of the invention, a system for improved code compression is provided, characterized in that it comprises an encoder further comprising means for growing a sub tree, means for pruning a sub tree and cost evaluation means arranged to control the growing and/or pruning a sub tree.

According to a third aspect of the invention, a computer program product according to the invention for improved code compression is provided, characterized in that it is in a machine readable form for executing the method according to the first aspect of the invention.

According to a fourth aspect of the invention, a network element of a communication system is provided, characterized in that said network element comprises encoder means further comprising means for growing a sub tree, means for pruning a sub tree and cost evaluation means arranged to control the growing and/or pruning a sub tree.

Other advantageous embodiments are described below. All the described embodiments of the invention can be combined in suitable part without any need to describe further variants of the embodiments of the invention, but however, without any kind of intention to limit only to those described exemplary embodiments. Term "to comprise" has been used and inflected as an open expression. The alike parts are indicated with same reference numerals, provided, that minor applicable differences might exist.

In the following, a term treatment of model is also used, as comprising growing and/or pruning of the model structures, as a common term for the both in any part or combination of them, to be used as relating to embodiments of the invention. Similarly, a term treatment of code is also used comprising coding and/or decoding according to the model as a common term for the both in any part or combination of them, to be used as relating to embodiments of the invention.

According to the first aspect of the invention, an improved method for code compression has been embodied. A method was developed that allows the automatic learning of decision trees used as a model of coding. With the method according to the invention, more efficient trees can be produced due to several improvements such as encoded data size estimation during construction. The method according to the invention combines in unique way the two phases of the learning algorithm (building known as such and pruning known as such) for the model creation, thus reducing its memory requirements. The method according to the invention is general in such sense that it is not dependent on the input provided that some requirements are met.

According to an embodiment of the invention, pre-extracted information is stored in a decision tree, which is comprised by the model to be used in the compression and/or decompression phases, treatment of code phases.

According to an embodiment of the invention the decision tree in a model can be formed and/or the pruning of it can be made by means that comprise functionality gained by software means and/or in suitable part by hardware means.

According to an embodiment of the invention, a decision tree is formed for a model by forming at least one sub tree therein. According to an embodiment of the invention, a sub tree is pruned. According to an embodiment of the invention, a first cost function is determined for estimating whether or not to grow said at least one sub tree into a node of the model.

According to an embodiment of the invention, a second cost function is determined for estimating whether or not to prune a sub tree in the model.

According to an embodiment of the invention, a first stopping criterion is determined for defining when stopping to grow a sub tree.

According to an embodiment of the invention, a second stopping criterion is determined for defining when stopping to prune a sub tree.

According to an embodiment of the invention, said first stopping criterion and said first cost function are used to evaluate the input for sub tree growing phase in the model.

According to an embodiment of the invention, said second stopping criterion and said second cost function are used to evaluate the output from the sub tree pruning phase in the model.

According to an embodiment of the invention input for the sub tree growing phase is varied for optimizing the model.

According to an embodiment of the invention such varying of the input for sub tree growing is used for producing an optimized input for the sub tree pruning phase, for the purpose of optimizing the model.

According to an embodiment of an invention such input for sub tree growing phase is used for producing an optimized output for the sub tree pruning phase, for the purpose of optimizing the model.

According to an embodiment of the invention, said sub tree growing and said sub tree pruning are performed dependently on each other for optimizing the total cost of the growing and pruning phases.

According to an embodiment of the invention the contributions of each cost of sub tree growing and/or pruning for the model are made iteratively.

According to an embodiment of the invention the code compression model comprises a tree.

According to an embodiment of the invention the model comprises a tree that comprises several sub trees that belong to the tree.

According to an embodiment of the invention, a test input is used in the model creation phase as test data for evaluating a sub tree growing and/or pruning phases.

According to an embodiment of the invention specific test data is used in the model creation phase.

According to an embodiment of the invention such test data for a model creation is predetermined with certain tolerances that indicate acceptable limits for an estimate on the cost for a phase comprising a step of pruning a sub tree.

According to an embodiment of the invention the pruning phase for the model creation is made recursively.

According to an embodiment of the invention the recursion is adaptive to the sub tree structure of the tree.

According to an embodiment of the invention the tolerances are determined iteratively.

According to an embodiment of the invention the growing and/or pruning are bijective operations.

According to an embodiment of the invention, in the model creation, at least two sub trees are treated in parallel in a treatment of model creation phase that comprises growing and/or pruning said sub trees.

According to an embodiment of the invention such parallel treatment of model comprises a phase involving cost function utilization for the cost optimization.

According to an embodiment of the invention, total cost of a pruning in a node is estimated on the basis of an ensemble of the cost of the children relevant to the node.

According to an embodiment of the invention, a model creation phase comprises a tree growing and/or pruning phase.

According to a second aspect of the invention, a system for improved code compression, comprising means for combined growing and pruning a tree in a model creation phase, is provided.

According to an embodiment of the invention, in a model creation phase, phase of growing a tree comprises a sub tree growing sub-phase, and use of test data to estimate the cost of the sub tree growing and/or pruning.

According to an embodiment of the invention, tree learner means, are used for the growing and/or pruning of a tree for a model and according to the second aspect of the invention as another exemplary embodiment of the invention.

According to an embodiment of the invention, a coder means is used for coding an input file by using a model with at least a tree. According to another embodiment of the invention decoder means are used for doing the inverse of coding the input According to an embodiment of the invention said file is any file in computer readable form as prepared for the coding.

According to an embodiment of the invention the coder means and/or decoder means are arranged to perform so that they leave the tree in a model unmodified during the coding/decoding.

According to an embodiment of the invention the coder means and decoder means are mutually bijective.

According to the embodiments of the present invention, there are two major contributions for a model creation: Embodiments of the invention combine the building and pruning phases, and estimates the size reduction gain during the model construction.

Term size reduction gain is used for characterizing a coder performance according to a model. The output size of the coder can be different in the two cases in which a pruning is made or not made in the model for a node. The size reduction gain, means a ratio or a difference between the two estimated size values of a node as coded as before and after the performed pruning.

According to an embodiment of the invention size reduction gain or its derivatives are used for determining an optimization criterion.

According to an embodiment of the invention size reduction gain or its derivatives are used for determining a cost function.

According to an embodiment of the invention size reduction gain or its derivatives are used for estimating the file size of coded code.

According to a third aspect of the invention, a system for improved code compression, comprising means for combined growing and pruning a tree for a model creation, is provided in a computer readable form.

According to an embodiment of the invention, a tree is pruned in parallel to the building process.

According to a fourth aspect of the invention, a network element of a communication system comprising at least two network elements and a network therebetween, for communicating coded code over a boundary layer between said network element and a second network element of the network, wherein said network element comprises encoder means further comprising means for growing a sub tree, means for pruning a sub tree and cost evaluation means arranged to control the growing and/or pruning a sub tree.

According to an embodiment of the invention the network element can be at least one of a base station and a mobile terminal.

The learning algorithm according to the embodiment of the present invention works on training sets that contain examples. An example is a token with assigned predictor values. A predictor can be any information available just before the token is encoded.

The learning algorithm according to an embodiment of the invention has two phases: building phase and pruning phase, which are combined in the following way: a sub tree is built, and the pruning algorithm is invoked for its root immediately for pruning the sub tree on the cost basis.

The building with the algorithm according to an embodiment of the invention is based on the entropy of the training data and uses two kinds of decisions: binary and multi-value decisions. A binary decision is a comparison of a predictor to one of its values; there are two possible decision outcomes: true or false. On the other hand, the multi-value decision is a predictor whose values are used for the decision outcomes. The detailed algorithm for growing as such can be found in [1] and a detailed algorithm for pruning can be found as such in [2].

The algorithm for mixed treatment of model, mixed growing and/or pruning algorithm according to an embodiment of the invention is recursive. Invoked at a node, it invokes a cost function for the node that returns with a value that tells the size of encoding a leaf instead of the tree, plus the estimated size of the compressed tokens of the training set associated with the root. Then it invokes itself for all children. The costs of all children are summarized and the cost of encoding the decision is added to this value. If this. total cost is not less than the cost of the leaf then the sub trees are dropped (pruned), a leaf is created and the return value is the cost of the node. Otherwise the node remains to be an internal node with its decision, and the return value is the summarized cost of the sub trees plus the encoding of the decision in the node.

A tree learner according to an embodiment of the invention can be implemented in C++ to learn ARM (RISC) processor code. However, a skilled man in the art would realize on the basis of the invention that learning the code of another processor (either CISC (Complex Instruction Set Computer), RISC (Reduced Instruction Set Computer), DSP (Digital Signal Processor), etc.) can be also implemented by requiring the determination of the predictors for that particular architecture.

The decoder according to an embodiment of the invention can be implemented in C and assembly can be optimized to be fast. However, the tree and/or the tree can be arranged to used in the coding and its opposite preferably in a bijective way and could also be implemented in hardware to speed up the process, in a suitable part. The JFFS2 (Journaling Flash File System 2) Linux file system can be extended with a model-based arithmetic coder that compresses ARM executable blocks with a decision tree as a model.

BRIEF DESCRIPTION OF THE DRAWINGS

Embodiments of the invention are explained in more detail by referring to the following figures, shown in the following only as examples on the embodiments of the invention without any intention to limit the scope of the invention.

BEST MODE FOR CARRYING OUT THE INVENTION

Figure 1A:
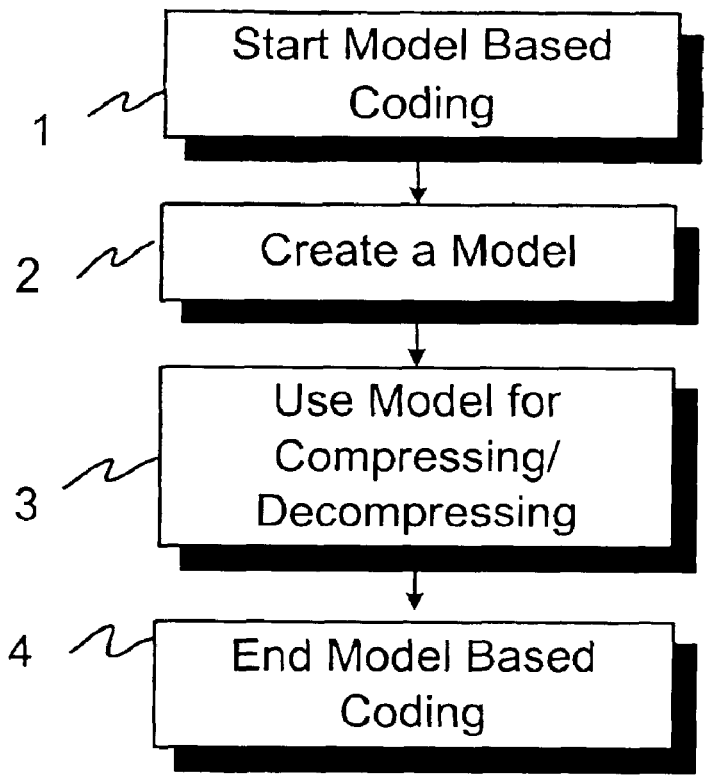
FIG. 1A illustrates a model based coding method.
Figure 1B:
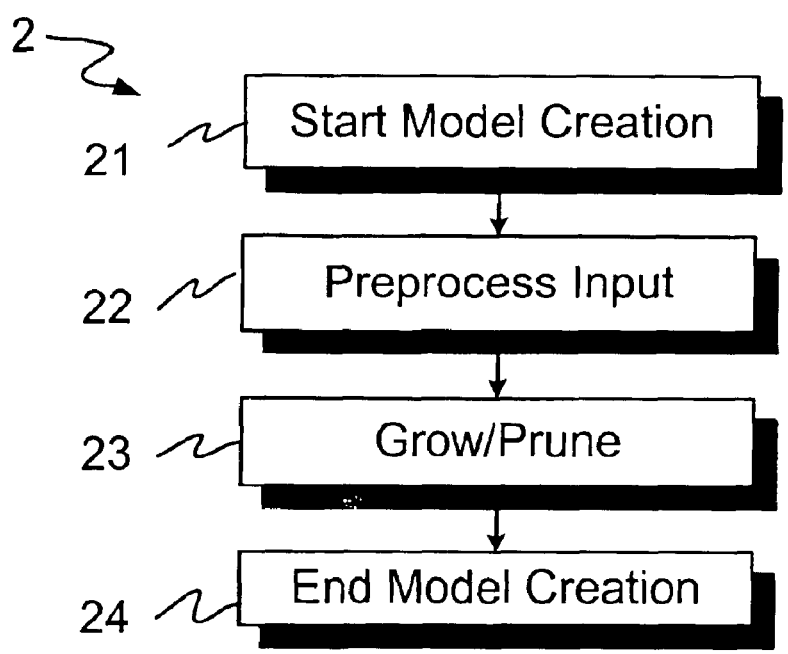
FIG. 1B illustrates a model creation sub-phase in FIG. 1A.
Figure 1C:
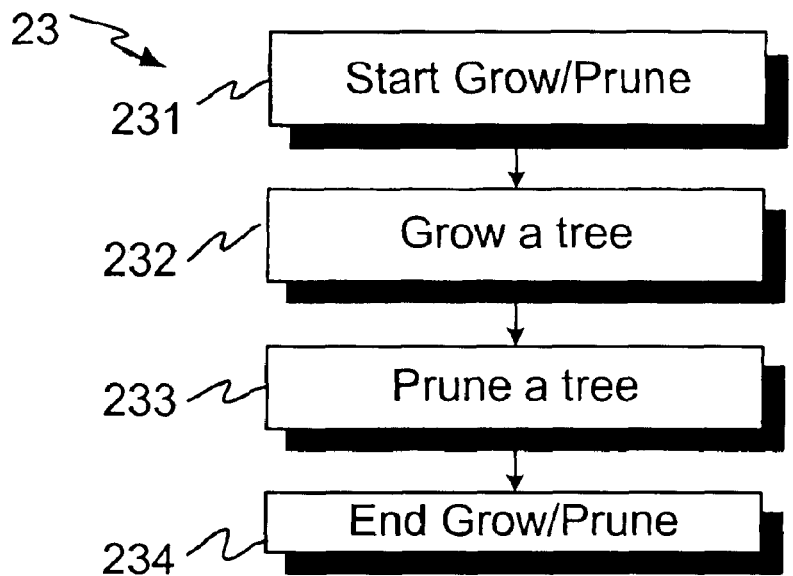
FIG. 1C illustrates a sub-phase in FIG. 1B.
Figures 1D, 1E:
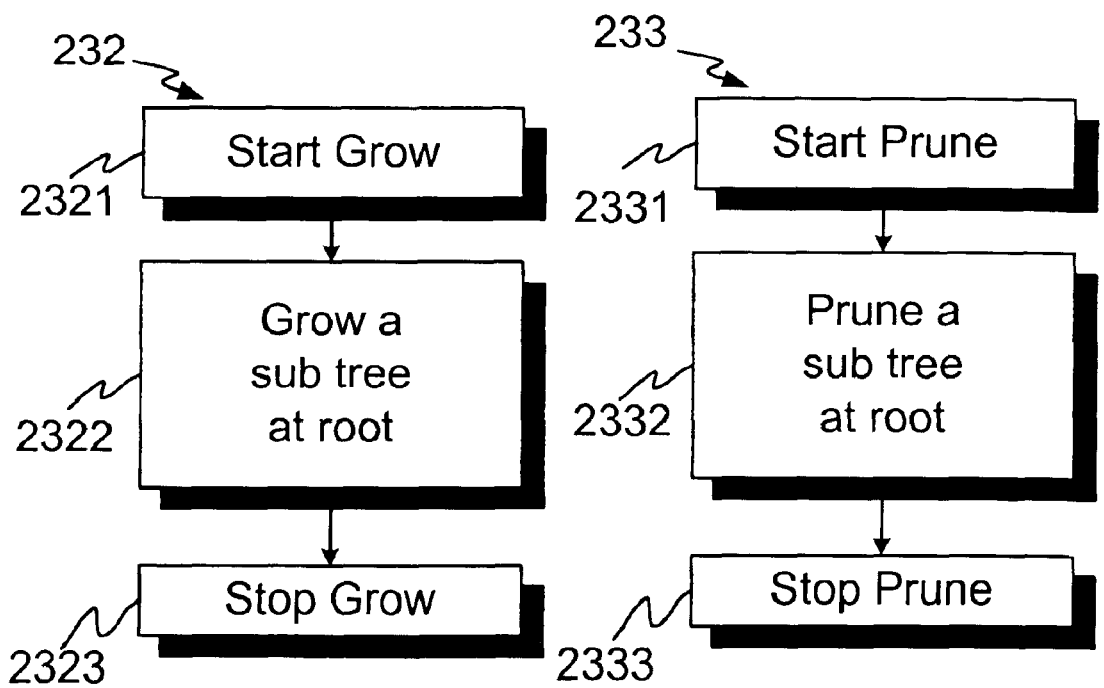
FIG. 1D illustrates a sub-phase in FIG. 1C.
FIG. 1E illustrates another sub-phase in FIG. 1C.
Figure 1F:
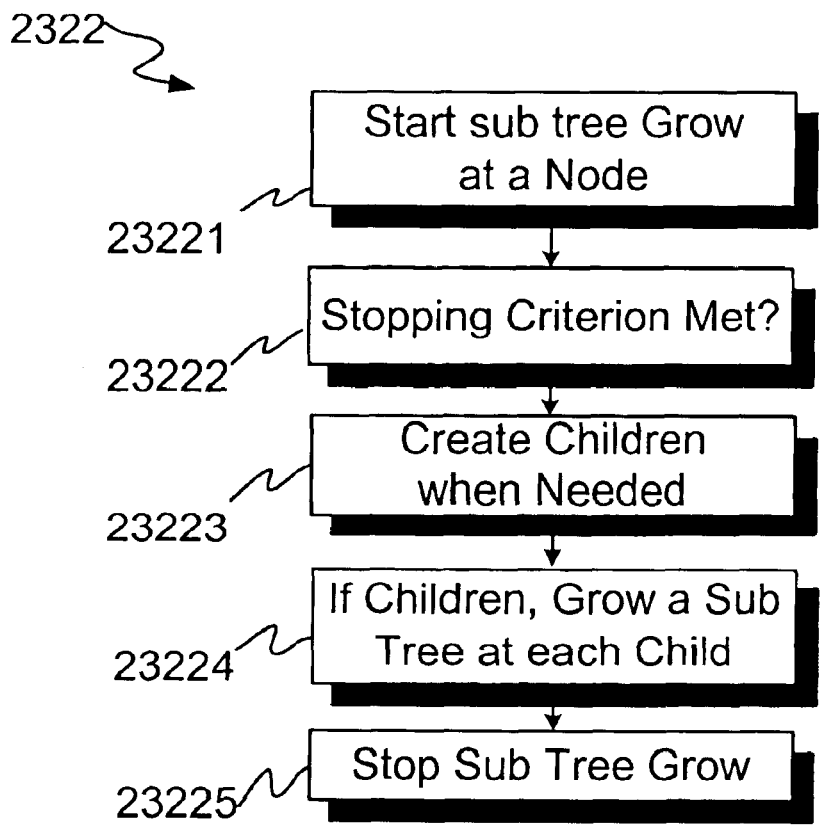
FIG. 1F illustrates a sub-phase in FIG. 1D.
Figures 2A, 2B:
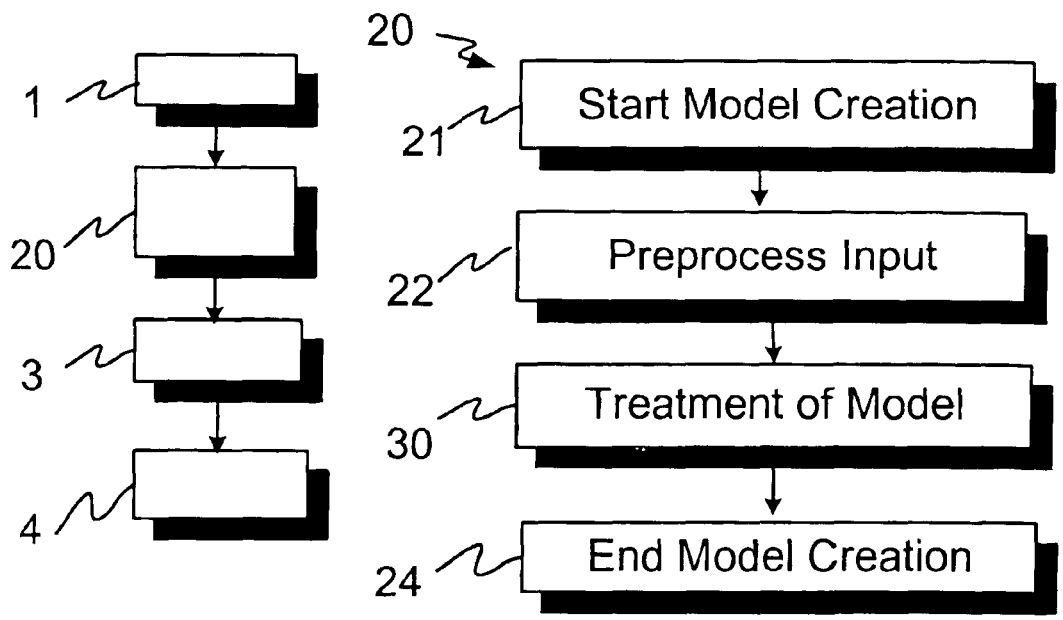
FIG. 2A illustrates a model based coding method according to an embodiment of the invention.
FIG. 2B illustrates a model creation sub-phase in FIG. 2A, according to an embodiment of the invention.
Figure 1G:
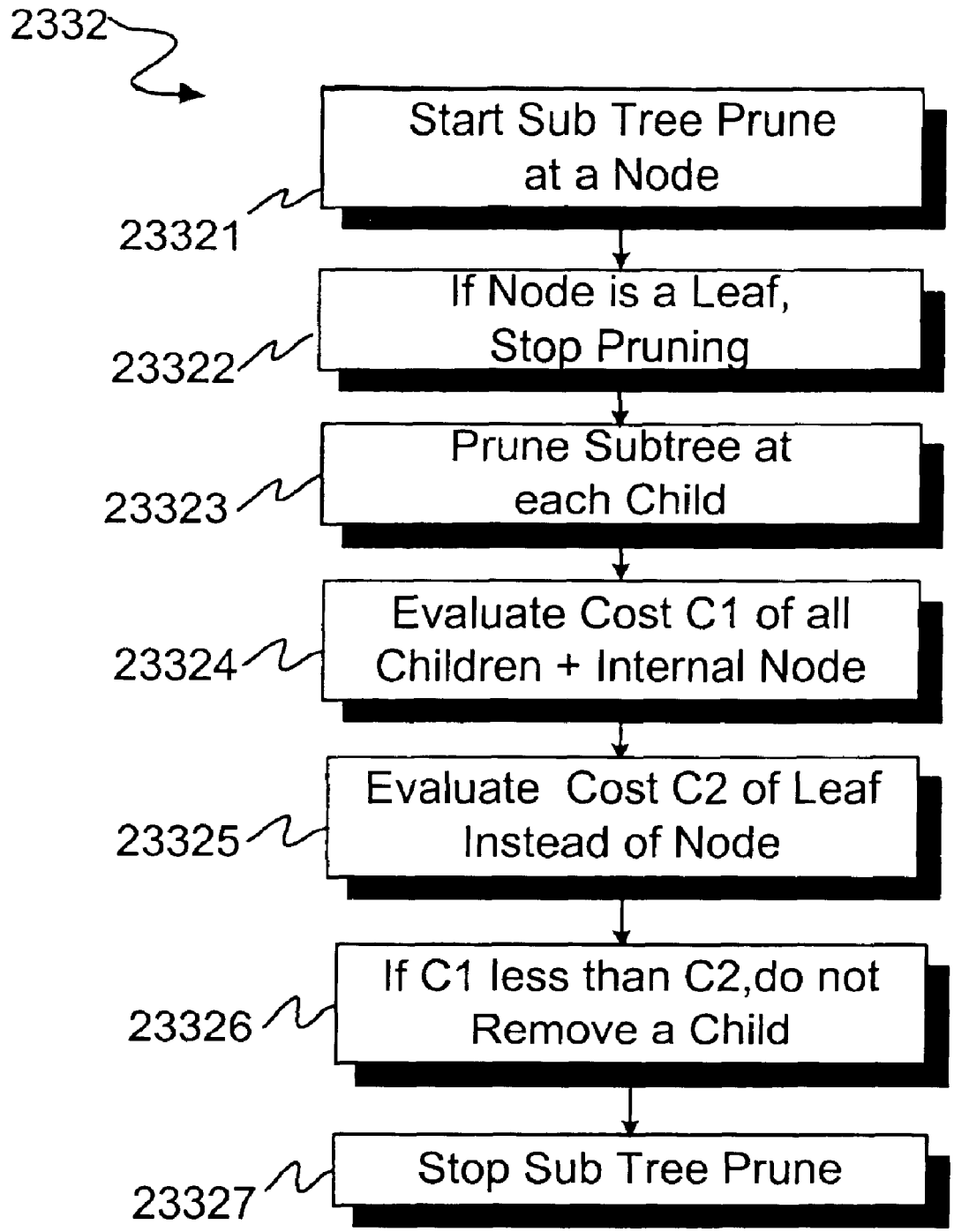
FIG. 1G illustrates a sub-phase in FIG. 1E.
Figure 3A:
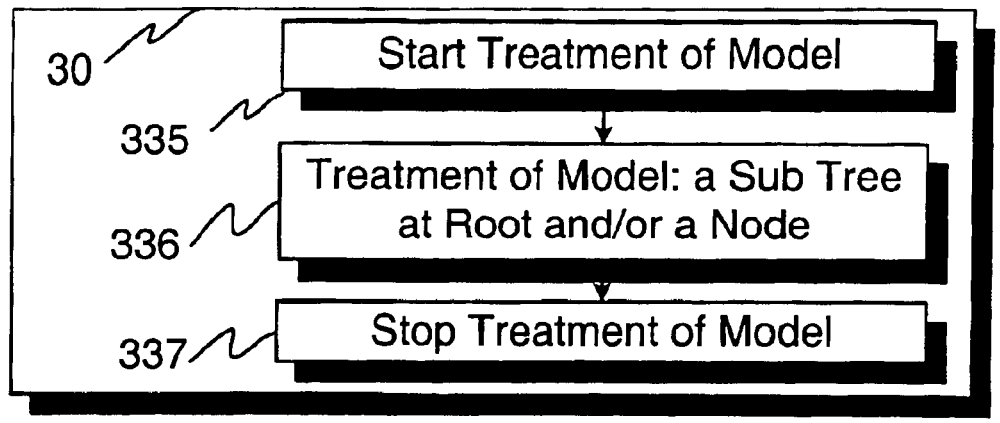
FIG. 3A illustrates a treatment of model according to an embodiment of the invention.
Figure 3B:
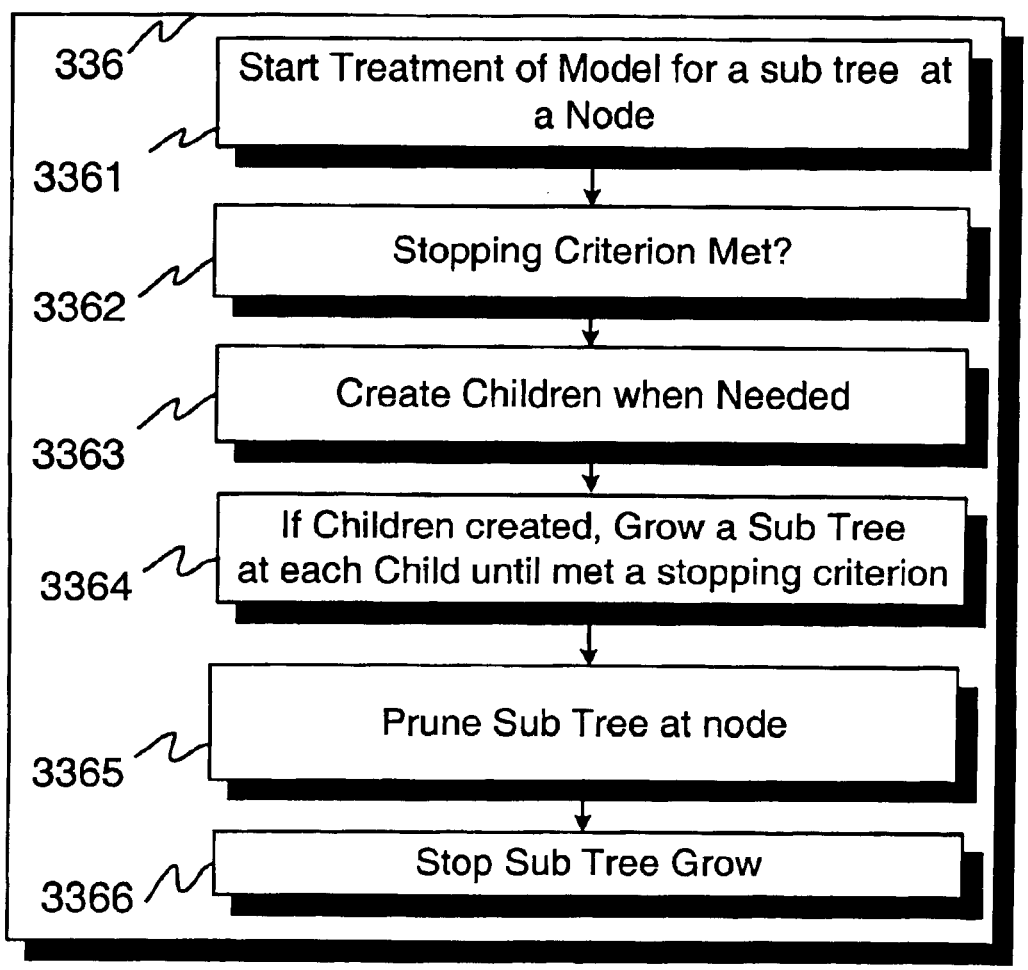
FIG. 3B illustrates a sub-phase in FIG. 3A.

In FIG. 2A, a model based coding method is indicated according to an embodiment of the invention, in which the sub-phase 2 and its hierarchy, that was indicated in the FIGS. 1A and 1B, is replaced by a phase 20 with its consequential hierarchy that is indicated in FIGS. 2B, 3A and 3B.

In FIG. 2A, the starting phase 1 can comprise preliminary process for the coding session in general, but also phases aimed for model creation. Such a phase as phase 1 can include settings made manually and/or automatically for the necessary parameters that control the general course of the coding session but also those for model creation and/or the information processing for that purpose. In phase 20 the model is created for the code to be coded according to the knowledge and information that is available due to the phase 1.

Nevertheless, in some embodiments of the invention the model creation phase 20 and the starting phase 1 can be essentially parallel at least in part, provided that the model creation is made iteratively for example. Making some sub-phases parallel may be beneficial in such embodiments that comprise iterative steps to be used in the model creation phase 20 on the basis of information collected in the staring phase 1.

In phase 3 the model is used for the code compression/decompression. In suitable part, the phase 4 can be made parallel with other phases of the method in FIG. 2A. The ending phase 4 can comprise such sub-phases that are related to post processing of the code that was just compressed/decompressed. However, the stopping phase 4 can also comprise in suitable part post processing of the product of the sub-phases. The stopping phase can comprise also arranging and/or purging temporary files or information that was needed in a particular sub-phase or several such.

Although the phases of the method in FIG. 2A are drawn in a certain order, the sub-phases can be parallel and/or serial in any combination in suitable part due to recursion and/or iteration, for example. In some embodiments of the invention there can be several identical sub processes going on, in a mutual phase that is determined on the model base.

In FIG. 3A a method sub-phase 30 for treatment of model according to an embodiment of the invention is described. The sub-phase 30 has a starting phase 335, in which preparations are made for the treatment of model, the mixed growing and/or pruning. In such a phase, as an initialization phase, which involves the initialization of the necessary tools or algorithms for performing the model creation comprising growing and pruning, as well as activating the pre-determined parameters that control the process, at least such parameters that have an initial value.

The sub-phase 30 is suitable for use in the model creation sub-phase 20, as shown in FIGS. 2A and 2B. In the sub-phase 336 treatment of model comprises grow and/or prune a sub tree at a root and/or node. The phase 336 is described in more detail in relation to FIG. 3B. When the phase 336 ends the phase 337 stops the growing and/or pruning. The stopping phase 337 stops the sub-phase 30. However, the stopping phase 337 can also comprise in suitable part post processing of the product of the sub-phase 30. The stopping phase can comprise also arranging and/or purging temporary files or information that was needed in the particular phase 30. However, it is possible that several sub-phases 30 are performed in parallel in an embodiment of the invention, may be so that they start and/or stop slightly in different moment of time. Nevertheless, each can have their own phases of starting 335 and stopping 337 individually or somewhat dependently with their own or partly common settings, but the embodiments of the invention are not intended to have any limitation on that. The phases 336 may be interlinked, but is not necessary in all cases.

In FIG. 3B the sub-phase 336 is illustrated in more detail. The model is created by phases of treatment of model comprising the phases of growing and pruning, which happen actually essentially in the same phase 336. The sub-phase 336 starts at the sub-phase 3361 for treatment of model for making a sub tree at root and/or a node. A root can be regarded as a node, too. The phase 3361 may comprise the necessary preparation for the starting the sub-phase 336 in general but also steps that are necessary for the next phase 3362, which has been described as a checking of whether or not a stopping criterion is valid. If any criterion was found that would lead to stopping the sub-phase 336 the phase is stopped at this node. If there is no such stopping criterion met that would lead to stopping the sub-phase 336, children are created 3363 whenever such are needed. In the phase 3364 it is checked that if children were created, a sub tree is grown at each child until met a stopping criterion that is used for controlling the growing. Such growing may continue in recursive manner, however not limited to such only, until suitable children are available. It may be so that also some other sub-phases of the sub-phase 336 are going on simultaneously when a particular sub-phase 3364 is executed. According to an exemplary embodiment of the invention, the phase 3364 can comprise phases of the phase 2322 in suitable part as arranged for the sub-phase 336. In a phase 3365 a sub tree is pruned at the node. According to an embodiment of the invention, the phase 3365 can comprise phases of the phase 2332 in suitable part as arranged for the subphase 336. The stopping phase 3366 can also comprise in suitable part post processing of the product of the sub-phase 336 at the ending. Such ending can comprise a sub-phase, in which the model, just newly created in the previous phases, is saved in a certain format and/or sent to a network location. The stopping phase 3366 can comprise also arranging and/or purging unnecessary information that was used during the model creation, but not valid anymore after the model creation ended, and can be purged in this phase, if not already done in an earlier phase. Alternatively such actions may be made instead in the phase 337, stopping the treatment of model. In such a case the stopping phase 3366 can comprise necessary steps to prepare for execution of phase 337. It is indicated, that the sub-phase 336 was performed as only through once, as an example, but the further sub-phases of the subphase 336 can be performed several times in series and/or in parallel in suitable part for the model creation, even recursively and can be controlled by the cost for example. One should notice that, according to an embodiment of the invention, root as such can be treated only once by a single type treatment of model, although root is a node. However, even if other nodes could be treated several times by a treatment of model, also when necessary in a recursive manner, in a preferred embodiment of the invention each node is treated only once.

Statistical measures can be also saved into a database for further use in the future. Such measures can comprise relevant information, for example, for the optimization of the method performance or predicting values relevant for later variants of a model for code compression task. Such values can be used for predicting and/or as a criteria for optimizing entropy, performance speed of the method in particular case, duration of the method performance, accuracy of the model for compression and/or its inverse, number of recursive steps in certain relation to the number and or the structure of the sub trees, or a certain combination thereof.

When the sub tree is grown, the pruning phase 3365 may be also linked to the growing phase 3364 and/or to phase 3362. When treating a model in a treatment of model, several sub trees can be treated simultaneously. The model can be arranged in an embodiment of the invention so that certain parts of the code can be treated in a phase for treatment of code in parallel.

A plurality of sub trees can be grown in parallel and/or simultaneously. Each of them can have a suitable process specific initialization, optimizing and stopping criteria, depending on the role for the model used for the code compression by a coder, arranged for each individual process. They may be interlinked, but not necessarily. In case of interlinking some of said sub processes it can be made for larger scale evaluation of costs, and aimed for the optimization of the whole cost of ensemble of the sub tree phases performed in parallel. It is possible to evaluate if the sub tree is already sufficiently structured to smaller sub trees. That can be made by evaluating the cost as based on the cost function or its derivatives. If there is a need of forming in addition to the present sub tree any further sub trees, a recursion can be used. However, cost can be evaluated accordingly and the forming of further sub trees is decided accordingly to an optimization criteria. If the optimization criteria indicates that there were no use of forming further sub trees, such sub-phase for the very sub tree ends and the necessary information are saved, and the no-longer-relevant-information is addressed to be purged, when there is no more use for said information to be purged, as regards the whole process of tree formation comprising at least one, but more likely, several sub trees.

Figure 4:
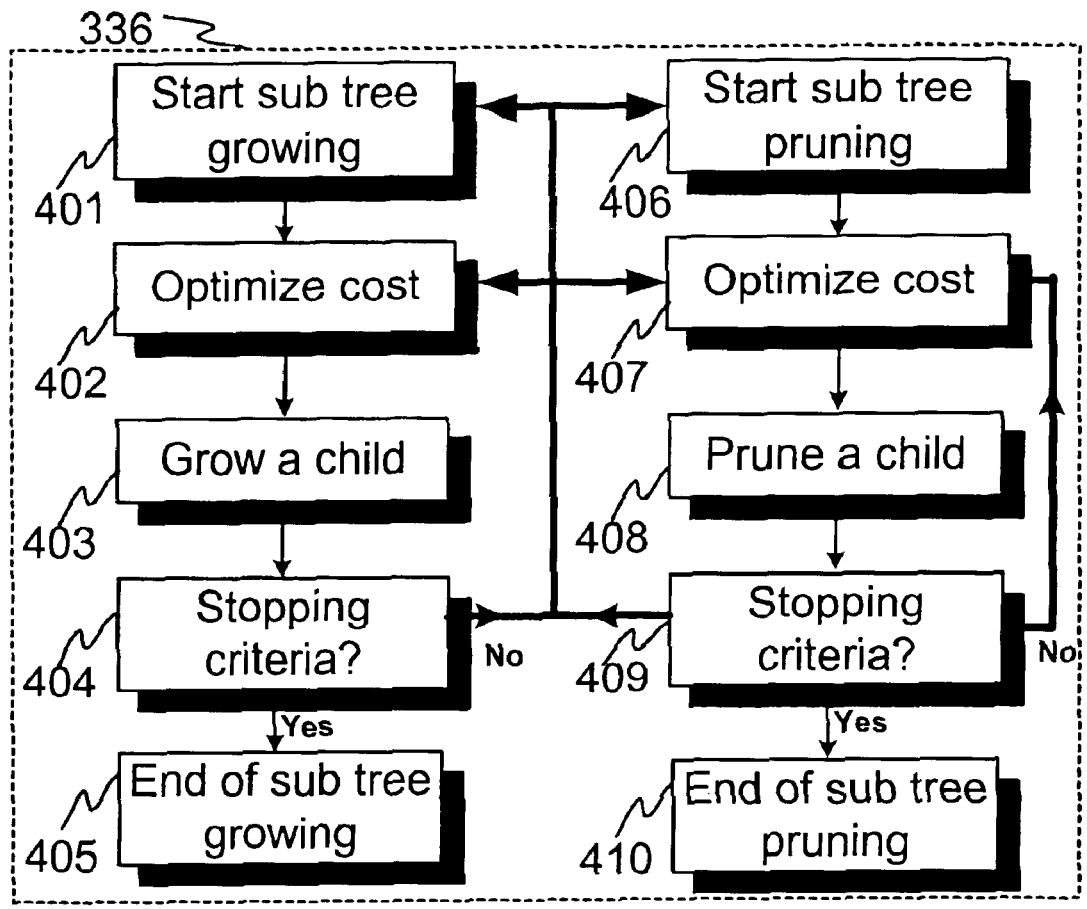
FIG. 4 illustrates a sub tree growing process and a sub tree pruning process implementation option according to an embodiment of the invention.

In FIG. 4, there is an illustration on an optional implementation of the phase 336 in which the model can be varied by a test data. According to an embodiment of the invention, growing of a sub tree in a model can be tested as an impulse and the cost evaluated as a response to said impulse. According to an embodiment of the invention pruning a tree can be tested as an impulse and the cost evaluated as a response to said impulse. According to an embodiment of the invention, the costs of growing and pruning are interlinked to evaluate an action of growing and pruning as an impulse arranged to facilitate a study of the cost as a response for determining the optimal way of the sub tree pruning and/or growing for the model creation.

When a sub tree growing is started 401, a cost is optimized 402 for growing 403 a child. Even further children can be grown until a stopping criterion is met 404. When met (Yes), the growing of child or children is ended 405. When not met (No), sub tree growing is allowed to continue and the costs are evaluated for the further parts of the sub tree or children.

When a sub tree pruning is started 406, a cost is optimized 407 for pruning 408 a child. Even further children can be pruned until a stopping criterion is met 409; such stopping criterion been derivable form the cost function for example. When met (Yes), the pruning of child or children is ended 405. When not met (No), sub tree pruning is allowed to continue and the costs are evaluated for the further parts of the sub tree.

In FIG. 4, a passage leads from stopping criteria 404, as not met, to the cost optimizing of growing a sub tree 402 and to the cost optimizing of pruning a sub tree 407. The same passage leads also to phases of starting a sub tree growing 401 and to starting a sub tree pruning 406. All the phases 401, 402 and 406 as well as 407 have a passage also from the stopping criteria of pruning 409. Nevertheless, cost function may be used as a single stopping criterion for stopping pruning, but in the invention, it is not limited only cost function derivable stopping criterion.

Figure 5:
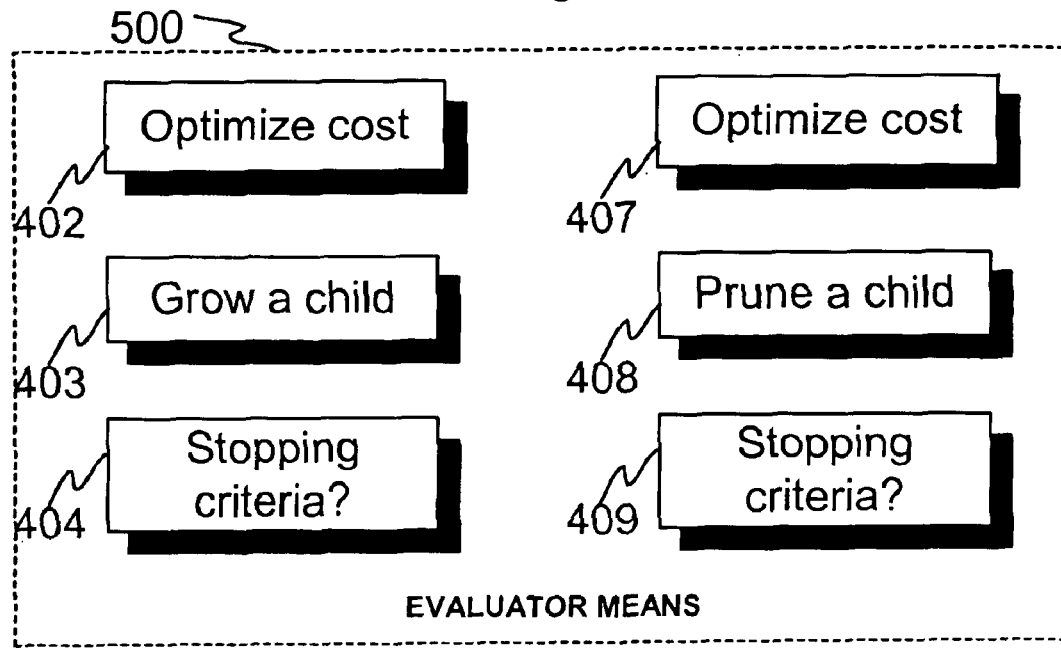
FIG. 5 illustrates an evaluation phase of growing and pruning a tree in accordance to FIG. 4, according to an embodiment of the invention.

How all that has been shown in FIG. 4, is controlled is illustrated in FIG. 5, which shows evaluator means 500 for evaluating the optimizing costs of growing 402 and pruning 407 as well as making decisions of doing actions of growing a child 403 or pruning a child 408 as based on the information available on the stopping criteria of growing 404 and/or pruning 409.

According to an embodiment of the invention, the cost and stopping criteria can be varied and the results evaluated for the optimization of the sub tree growing and/or pruning, against an evaluation criteria. Evaluator means 500 can be then used for predicting the most optimum result for the model. Several slightly differently tuned models can be created for different purposes, according to the properties of the coder to be used for instance. Therefore, optimum of the code compression can be achieved for different coders.

The evaluation criteria to be used in accordance of the evaluator means 500 for a model, can relate to the speed of the code compression, that of its particular phase, duration of performance in a set of phases, word length of the code, the structure of the code to be compressed and/or classification of the parts in the code. However, the evaluation criteria can be ultimately related also to a measure of performance in one aspect as gained but simultaneously gained in expense of another aspect.

The optimization criteria are similar to the evaluation criteria, but optimization criteria. have a more local nature so that evaluation criteria may weight optimization criteria in a certain way, for example when searching an optimal model for a certain code compression duty to find out the best model for the best performance in the task of code compression.

Figure 6:
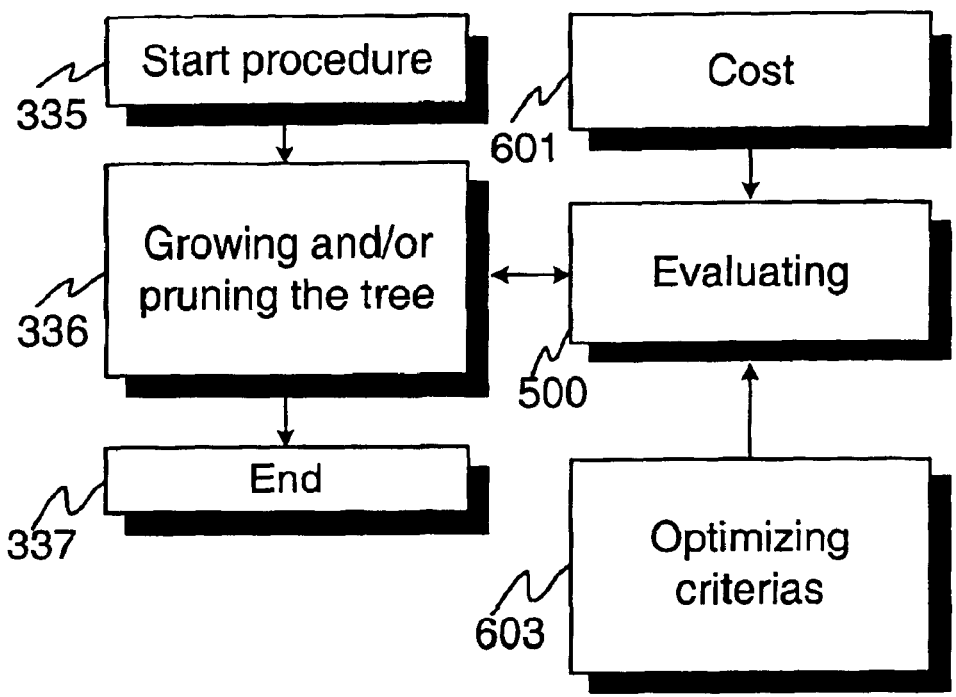
FIG. 6 illustrates use of evaluator means for evaluating treatment of model.

In FIG. 6, the use of the evaluator means 500 is demonstrated. The treatment of model, growing and/or pruning 336, can be evaluated 500 by the evaluator means. However, according to an embodiment of the invention, also the whole process can be evaluated via the cost 601 of the process, as selected according to the optimizing criteria 603, which can be weighted in a certain way in the evaluation. The evaluation criteria can be defined via the selection of the weights of the optimization criteria. However, derivatives of the cost function are the most desired when determining optimization criteria.

A model creation for a code compression method for compressing code as a treatment of code, according to an embodiment of the invention, has a phase for treatment of model for growing a sub tree into a tree and a phase of pruning said sub tree preferably in a same phase of model creation. In the embodiments of the invention, the actions for treatment of model can be controlled by certain stopping criteria determined for each separately, for guarantee independent operation of the both so as to be used also reliably in combination. In an embodiment of the invention the cost for a treatment of model or a series of such, in an iterative and/or recursive embodiment of the invention, are optimized against optimization criteria, which is preferably a derivative from a cost function. For defining the cost criteria in a more deterministic way, a cost function is used in the evaluation, whether or not to have treatment of model on said at least one sub tree in a model. The cost criteria for a cost can be based to a file size, its compression details, bit and/or message length, structure or other details, their combination or other derivatives that could have relevance for the cost of treatment of model and/or treatment of code.

According to an advantageous embodiment of the invention test data can be used as an impulse for estimating a cost for treatment of model, to be evaluated as a response to the treatment of model as measured against an optimization criteria for said treatment of model. As an advantageous variant of such an embodiment is a method in which the model size and the coded size are been estimated as a response according to a test data used as the impulse. In such a case for example the file size comprising the model size and the size of the compressed code can be used for forming an optimization criteria to be used.

The test data can be arranged to comprise sets of test data as to form an ensemble of impulses for a treatment of model for evaluation against an optimization criteria. In such a case growing and/or pruning can be varied in order to produce different costs for the optimizing process of the model. So, it is also possible to vary the test data in a manner that produces costs for an action or treatment of model so that the pruning phase can be varied as based on the growing cost and/or growing phase can be varied as based on the pruning cost.

Such test data can be a standard part of for model creation or a collection of such, but certain parts of the code to be compressed itself can be used for the purpose of creating the model and/or fine-tuning the model. Test data can be based in the file structure and/or its periodicity in small or large scale.

According to an advantageous embodiment of the invention, it is useful to set certain tolerances for a cost for a treatment of model. For example, tolerances can be used for checking a child size, as to be in certain acceptable range. In such a case it is easy to automatically check if the cost is on an acceptable level, which improves the selection of treatments of model in a certain way, for example for that how deeply recursion the sub trees are to be formed. The tolerances can be set in such a way that they can be iteratively affected if needed, for a recursive treatment of model for example. Tolerances as limiting values can be used also to define a response for a certain cost as an impulse as conveyed from growing and/or pruning phase in model creation.

During a treatment of model it is useful to know that the code compression is finally performed bijective way, without hysteresis or like phenomena therebetween as a consequence of a treatment operation and the inverse of it. Therefore, tolerances may be estimated in an embodiment of the invention in such a manner that in a model creation phase a certain treatment of model can be analyzed by a test data and can be controlled if necessary, in order to preserve bijectivity as much as possible. In one embodiment of the invention there is a phase in which compressing and decompressing of test data are made as a test of bijectivity of the model. Warnings can be generated if the model does not comprise bijectivity in the set tolerances, in order to avoid compressing code according to a non-bijective model. Such test data utilization may be used for checking the integrity of the model in such a case the model is transferred.

Skilled men in the art would appreciate such embodiments of the invention in which different models are provided for availability. Such models might be chosen that differ from each other. in certain degree, for different optimization criterion to be taken into account for the best result of the model based coding for the code to be coded, for example. Such embodiments may be very useful when solving potential compatibility problems that arise form different types of hardware and software to be used in combination, in a network and/or parts of such.

The optimization of the code compression model can be applied to a communications environment. So, the model for code compression method according to an embodiment of the invention can be optimized in respect of growing and/or pruning of a tree in the model for a code to be communicated in a communications network for a network comprising at least two network elements operable in the communication duties between said network elements. According to another embodiment of the invention the growing and/or pruning phases of the model creation are each optimized for storing said code, irrespective whether the code is a message, data file or an executable.

The method can be performed most advantageously in a system for model creation for a code compression, which model creation system has means for growing a sub tree, means for pruning a sub tree and cost evaluation means arranged to control the growing and/or pruning a sub tree. It is advantageous to implement the system, at least partly, by a computer program product in a machine-readable form. However, in certain cases hardware implementation for a part of said means may be useful, for example if the growing and/or pruning were heavily loading a computer performing in a related duty.

Figure 7:
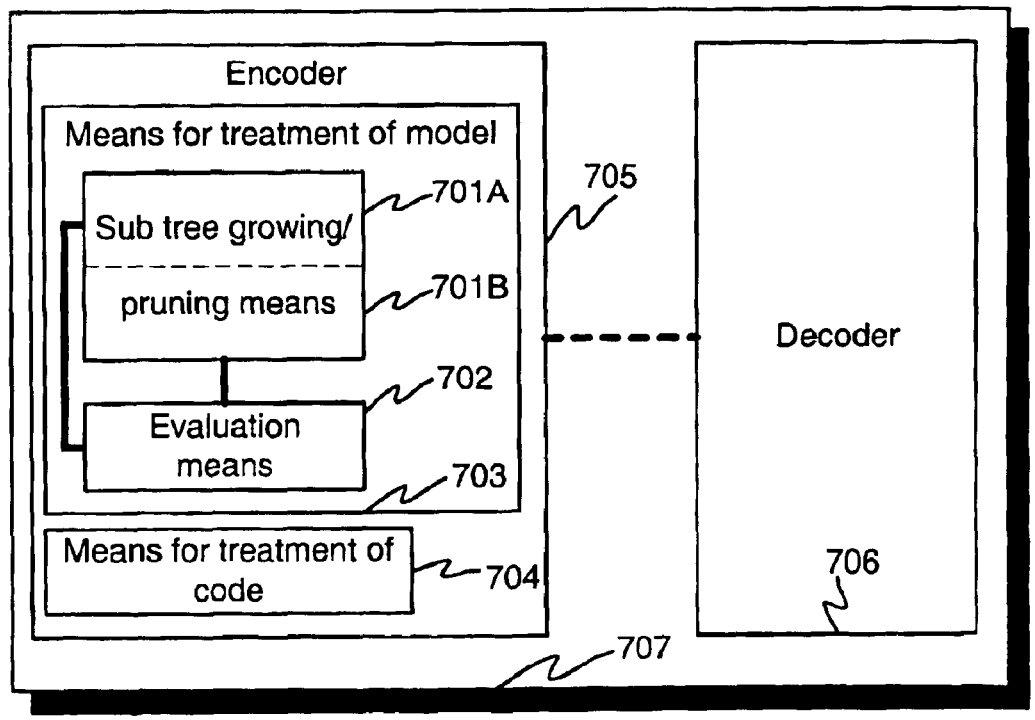
FIG. 7 illustrates a system according to an embodiment of the invention.

In FIG. 7, it is demonstrated in a very general level, in an exemplary way, a coding system 707 according to an embodiment of the invention. In the coding system 707 there are indicated an encoder means 705 for the code to be compressed, capable to compress the code, as input data, comprising the treatment of model by the means for treatment of model 703 and capable to the treatment of code by the means for treatment of code 704. The means for treatment of model comprise means for growing 701A and/or pruning a tree 701B, which are preferably integrated together according to an embodiment of the invention, to be used in control of the cost evaluation means 702. The integration is indicated by drawn the line dashed, and the control by the thick lines. The system in FIG. 7 also comprises a decoder means 706, which is arranged to do the opposite of the encoder means 705 to a desired extent, preferably as bijectively as possible in the allowed tolerances. The means for treatment of code 704 is arranged to use the model for performing the treatment of code. One should notice that the code to be compressed by the encoder means 705 and/or decoded by the decoder means 706, can comprise a stored code from a data storage, for instance, but can comprise also a code transmitted/received from a wireless and/or wired media in suitable part. The code can comprise executable part, but also a data part as such. It should be noted that the encoder means 705 and decoder means 706 can be situated even into the same casing, for example when arranged for use for treating a code in compressed way, but they 705, 706 can be also separated by a distance, provided that there is a signal transfer coupling there between, but the distance can be considerably large, especially when using the coupling in a wireless application, however not to limit their 705, 706 use, the coupling or the distance there between. A dashed line between the encoder means 705 and decoder means 706 demonstrates the distance.

The illustration in FIG. 7 does not comprise all the details that would be needed for a full physical, programmatic and/or a combined unit thereof. Details that were omitted comprise for example, processors and/or memories, which may be used during the model creation and/or its use. Nor are there shown signal paths, terminals used for saving and/or transferring the code in compressed and/or uncompressed form. Neither are there shown items of further infrastructure to support the performance of said omitted details. Therefore, only those parts of the system which are arranged for implementing the method according to an embodiment of the invention are illustrated, so as to enable a skilled man to operate the invention on the indicated basis. On the basis of the shown embodiments of the invention, a skilled man in the art can of course fine tune the system in FIG. 7 for a special code to be compressed, but without deviating from the scope of protection.

Figure 8:
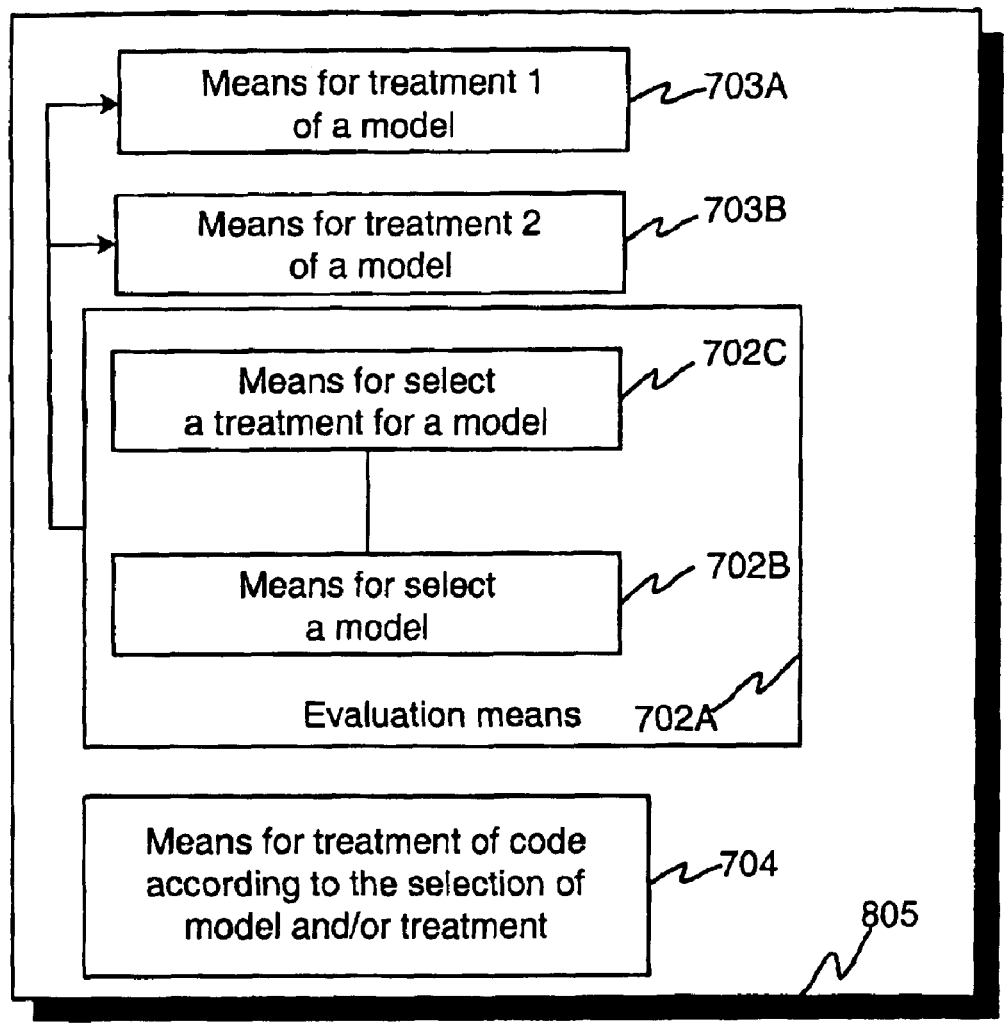
FIG. 8 illustrates a detail from a system according to an embodiment of the invention.

In FIG. 8, it is demonstrated in a very general level, in an exemplary way, a detail of a coding system 707 according to an embodiment of the invention. In FIG. 8 the detail relate to an encoder means 805 for the code to be compressed, capable to compress the code, comprising the treatment of model by the means for treatment of model 703A, 703B and capable to the treatment of code by the means for treatment of code 704. The encoder in FIG. 8 can be used as optional to the encoder 705 in the system 707 in FIG. 7, provided that the decoder 706 is arranged to perform in bijective way to decode the code coded by the encoder 805, in the certain allowed tolerances.

As the encoder in FIG. 7 may be used for all the data to be encoded, or so that just a suitable part of the data may be encoded with such an encoder 705, so that the encoded part of the input as encoded, forms the input for the decoder 706. It is possible that the encoding can be made once for all the input data, or several times, if the encoding is bijective enough also, in series. Also, a part of the input data to be treated by the encoder can be treated once, and/or another part by a different number of times. Said other part may comprise parts, that are to be encoded, but also such parts that are meant to be per se, not to be treated at all.

However, it is possible, that such input data for the encoder 705 may comprise portions that should be treated slightly in a different way, each part possibly by a different model, for the most beneficial compression result with the optimum cost and allowable tolerances for each part. It may be so, that requirements for writing into a memory and/or to send data into a communication network may have a different optimal way for an input data to be treated. It may be also so that in either case the type of input data, whether it comprises executables, scripts, voice and/or data as such to be treated by the encoder, may need a slightly different model and/or treatment for the optimal cost within the tolerances. The growing and/or pruning of a tree may be done in slightly different way for each type of data or a combination thereof for the best result. It is possible to operate similarly with the encoder 705 as with the encoder 805, but however with a larger selection of options with the encoder 805. For each part of data, an optimum treatment and/or model can be applied by using encoder indicated in FIG. 8 in which the encoder 805 comprises evaluation means 702A, which further comprise means 702B for selecting a certain type of model and/or means 702C for selecting a treatment for a model. Respectively the means, 703A, 703B for treatment 1 and/or treatment 2, of a model, can comprise their own evaluation means, similarly as indicated in FIG. 7 for means 703 by the item evaluation means 702. Such means can be arranged for the internal use of said means 703A, 703B, however not necessarily, but if existing, preferably as arranged for co-operation in suitable part with the evaluation means 702A. If not existing such evaluation means similar to those of 702 for the internal use in means 703A and/or 703B, the operations of means 703A and/or 703B can be controlled in suitable part by the evaluation means 702A. Although there is indicated only means 703A and 703B in FIG. 8, the number of corresponding means can be different, depending on the optimization of the code compression for a certain input data type, utilization environment or the available plurality of such, including their combinations.

It is also possible, that according to an embodiment of the invention such means are implemented by a common part to an ensemble of said such means and an effective part to make the difference in the -treatment of model. It is thus preferred that means 703A and/or 703B comprise parts selectable from a preset ensemble of such parts that influence on the performance of the means 703A and/or 703B, to adjust the treatment of model for a certain type of input data.

A further notice is made to state, that the means 703A and/or 703B can be preset for a certain treatment of model and/or treatment of code for a type of input data. In an embodiment according to the invention, the means 703A and/or 703B can each be modified according to the guidance of the evaluation means 702A.

A skilled professional in the field knows that encoder 705, 805 and the corresponding decoder 706 are arranged to do the opposite operations in a bijective way. When using encoder 805 according to an embodiment of the invention, a skilled professional in the art would immediately recognize that for preserving the bijectivity in acceptable tolerances, the above mentioned features of the encoder 805 should be taken into account correspondingly for the decoder, which can be then a modified version of the decoder 706. Therefore, the modifications to the decoder 706 are not further discussed.

However, such a further embodiment of the invention that comprise modifying the means 703A and/or 703B, but in a self-modifying way during a compression may be advantageous only if the bijectivity can be preserved and the modifications in the model can be communicated or taken into account for the decoder 706 of the system 707, to keep the encoding and decoding as bijective operations as possible in the certain tolerances. Such embodiment may be useful for instance if considering updating of the model on line according to the message content for the best optimization result.

According to an embodiment of the invention, a communication network element, arranged to communicate through a boundary layer between said network element and another element of said network, said network element can be provided with an encoder means according to an embodiment of the invention, further comprising means for growing a sub tree, means for pruning a sub tree and cost evaluation means arranged to control the growing and/or pruning a sub tree.

According to an embodiment of the invention, a communication network element, arranged to communicate through a boundary layer between said network element and another element of said network, said network element can be provided with an decoder means according to an embodiment of the invention, to decode the code encoded by the encoder means, such decoding to be, according to an embodiment of the invention, performed preferably in a bijective way in the certain tolerances.

Figure 9:
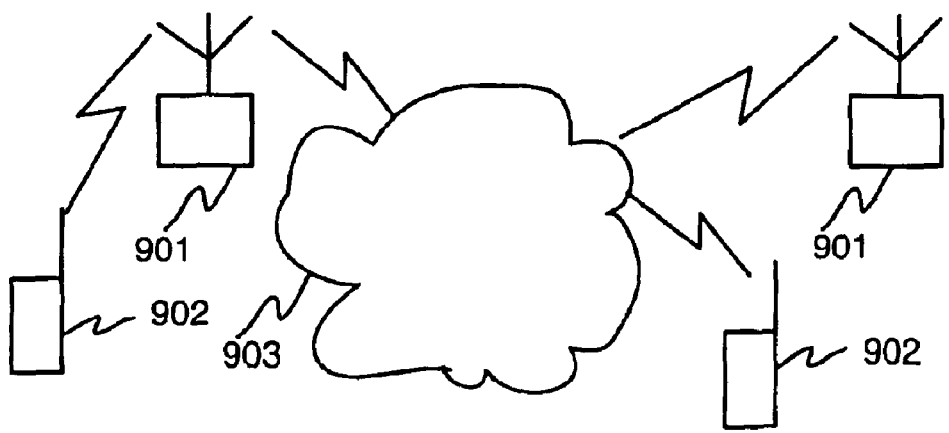
FIG. 9 illustrates network and network elements according to an embodiment of the invention.

In FIG. 9, a very simple example of system for a communication network is indicated according to an embodiment of the invention. In the system, there are mobile terminals 902 to be connected to the communication network 903 via base stations 901 or via other such network elements that belong to the communication network infrastructure as such, as indicated by the lightning symbols. A network element that comprises the encoder means according to an embodiment of the invention can be the mobile terminal 902. Such mobile terminal 902 can comprise the decoder means according to an embodiment of the invention. A skilled man in the art appreciates that the other said network element may be a base station, especially also such a base station that operates as, or in connection to, a switching center for the network 903, arranged to operate for switching messages from a network element to another over a boundary layer there between, or into a device in another system for example such as plain old telephone system.

According to an embodiment of the invention, a network element of such a communication network in FIG. 9 comprises encoder means and/or decoder means for decoding that encoded by the encoder means.

What is claimed is:

1. An improved code compression method for compressing code, characterized in that the method comprises a model creation phase comprising a plurality of sub-phases, each sub-phase comprising a treatment of model comprising growing a sub tree into a tree of said model and a phase of pruning said sub tree.

2. An improved code compression method according to claim 1, wherein the method comprises additionally another phase for treatment of code, according to said model.

3. An improved code compression method according to claim 1, wherein a first stopping criterion and a second stopping criterion are determined for defining when stopping the growing and/or the pruning.

4. An improved code compression method according to claim 1, wherein said sub tree growing and said sub tree pruning are performed dependently on each other for optimizing a total cost of the treatment of model.

5. An improved code compression method according to claim 4, wherein the method comprises a training phase for optimizing the treatment of model according to an optimization criterion.

6. An improved code compression method according to claim 5, wherein a cost is estimated against a cost function arranged to be available for estimating whether or not to have treatment of model on said at least one sub tree.

7. An improved code compression method according to claim 5, wherein test data is used as an impulse for a treatment of model and the cost, as a cost for treatment of model, is evaluated as a response to the treatment of model as measured against an optimization criteria for said treatment of model.

8. An improved code compression method according to claim 7, wherein test data is arranged to comprise sets of test data as to form an ensemble of impulses for a treatment of model evaluation against an optimization criteria.

9. An improved code compression method according to claim 8, wherein the method has a phase in which test data of the pruning phase is varied as based on the cost from growing a node and/or the test data of the growing phase is varied as based on the pruning cost.

10. An improved code compression method according to claim 1, wherein test data is used for treatment of model optimization, said test data comprising a standard part of code.

11. An improved code compression method according to claim 10, wherein said test data has pre-determined tolerances to yield an estimate on the cost in a process comprising a step of having treatment of model on a sub tree.

12. An improved code compression method according to claim 11 wherein the tolerances are determined iteratively.

13. An improved code compression method according to claim 1, wherein bijectivity for the treatment of model and/or treatment of code is controlled.

14. An improved code compression method according to claim 1, wherein the method is applied recursively to a sub tree.

15. An improved code compression method according to claim 1, wherein pre-extracted information is stored for a treatment of model comprising a sub tree.

16. An improved code compression method according to claim 1, wherein the growing and/or pruning phases are each optimized, for a code to be communicated in a communications network, for such a network that is comprising at least two network elements operable in the communication duties between said network elements.

17. An improved code compression method according to claim 1, wherein the growing and/or pruning phases are each optimized for storing said code.

18. A system for code compression, characterized in that it comprises an encoder comprising means for growing a sub tree in a sub-phase of growing a tree, means for pruning said sub tree and cost evaluation means arranged to control both the growing and pruning of said sub tree.

19. A system according to claim 18, wherein said means are implemented at least partly by a computer program product.

20. A system according to claim 18, wherein said means comprise a hardware implementation for a part of said means.

21. A computer program product, characterized in that it is in a machine-readable form for executing a method according to claim 1.

22. A computer program product, characterized in that it is in a machine-readable form for implementing a system according to claim 18.

23. A network element of a communication system comprising at least two net work elements and a network there between, for communicating coded code over a boundary layer between said network element and a second network element of the network, characterized in that said network element comprises encoder means comprising means for growing a sub tree in a sub-phase of growing a tree, means for pruning said sub tree and cost evaluation means arranged to control both the growing and pruning a of said sub tree.

24. A network element of a communication system according to claim 23 wherein the net work element comprise a base station.

25. A network element of a communication system according to claim 23 wherein the net work element is a mobile terminal.

26. A network element of a communication system according to claim 23 wherein the network element further comprises decoder means for decoding a code encoded by the encoder of claim 23.

27. An improved code compression method for compressing code, characterized in that the method comprises a model creation phase which has a phase of treatment of model comprising growing a sub tree into a tree of said model and a phase pruning said sub tree, wherein said sub tree growing and said sub tree pruning are performed dependently on each other for optimizing a total cost of the treatment of model according to an optimization criterion, so that the cost is estimated against a cost a cost function arranged to be available for estimating whether or not to have treatment of model on said at least one sub tree.

* * * * *

UNITED STATES PATENT AND TRADEMARK OFFICE
CERTIFICATE OF CORRECTION

PATENT NO. : 6,917,315 B2
DATED : July 12, 2005
INVENTOR(S) : Tamás Gergely et al.

It is certified that error appears in the above-identified patent and that said Letters Patent is hereby corrected as shown below:

Column 20,
Line 25, "a" should be deleted.
Line 41, after "pruning" insert -- of --.
Line 45, the second "a cost" should be deleted.

Signed and Sealed this

Thirty-first Day of January, 2006

JON W. DUDAS
*Director of the United States Patent and Trademark Office*